United States Patent
Peng (10) Patent No.: US 9,145,295 B2
(45) Date of Patent: Sep. 29, 2015

(54) ULTRA-FAST SUSPENDED GRAPHENE NANO-SENSORS SUITABLE FOR LARGE SCALE PRODUCTION

(75) Inventor: Haibing Peng, Houston, TX (US)

(73) Assignee: The University of Houston Systems, Houston, TX (US)

( * ) Notice: Subject to any disclaimer, the term of this patent is extended or adjusted under 35 U.S.C. 154(b) by 659 days.

(21) Appl. No.: 13/547,450

(22) Filed: Jul. 12, 2012

(65) Prior Publication Data
US 2013/0018599 A1     Jan. 17, 2013

Related U.S. Application Data

(60) Provisional application No. 61/506,678, filed on Jul. 12, 2011.

(51) Int. Cl.
| | |
|---|---|
| H01L 21/66 | (2006.01) |
| B82Y 15/00 | (2011.01) |
| H01L 29/423 | (2006.01) |
| H01L 29/16 | (2006.01) |
| B82Y 10/00 | (2011.01) |
| H01L 29/778 | (2006.01) |

(52) U.S. Cl.
CPC ............... B82Y 15/00 (2013.01); B82Y 10/00 (2013.01); H01L 29/1606 (2013.01); H01L 29/42372 (2013.01); H01L 29/778 (2013.01)

(58) Field of Classification Search
CPC .. B82Y 15/00; B82Y 10/00; H01L 29/42372; H01L 29/1606; H01L 29/778
See application file for complete search history.

(56) References Cited

U.S. PATENT DOCUMENTS

| | | | | |
|---|---|---|---|---|
| 2010/0021708 | A1* | 1/2010 | Kong et al. | 428/220 |
| 2012/0058350 | A1* | 3/2012 | Long et al. | 428/446 |
| 2012/0168724 | A1* | 7/2012 | Park et al. | 257/29 |
| 2012/0206012 | A1* | 8/2012 | Rosenblatt et al. | 310/300 |
| 2012/0212242 | A1* | 8/2012 | Masel et al. | 324/693 |
| 2012/0273455 | A1* | 11/2012 | Lackowski et al. | 216/20 |

FOREIGN PATENT DOCUMENTS

WO    2010/065517    6/2010

OTHER PUBLICATIONS

European Patent Office; International Preliminary Report on Patentability; PCT Application No. PCT/US2012/046417; Jan. 23, 2014.
European Patent Office; International Search Report and Written Opinion; PCT Application No. PCT/US2012/046417; Sep. 28, 2012.
Levendorf, M.P., et al; Transfer-Free Batch Fabrication of Single Layer Graphene Transistors; Nano Letters, vol. 9, No. 2, Dec. 9, 2009.
Lee, S., et al; Hot Electron Transport in Suspended Multilayer Graphene; Physical Review B, vol. 82, No. 4, Jul. 1, 2010.

(Continued)

*Primary Examiner* — Shaun Campbell
(74) *Attorney, Agent, or Firm* — Jackson Walker L.L.P.

(57) ABSTRACT

A graphene nano-sensor with a suspended graphene flake electrically connected to metal electrodes. The graphene nano-sensor is capable of detecting single molecules in an atmosphere through a change in electrical conductance through the graphene flake.

15 Claims, 10 Drawing Sheets

(56) References Cited

OTHER PUBLICATIONS

Aleman, B., et al; Transfer-Free Batch Fabrication of Large-Area Suspended Graphene Membranes; ACS Nano, vol. 4, No. 8, Aug. 24, 2010.

Guermoune, A., et al; Chemical Vapor Deposition Synthesis of Graphene on Copper With Methanol, Ethanol, and Propanol Precursors, Carbon, vol. 49, No. 13, May 28, 2011.

* cited by examiner

ULTRA-FAST SUSPENDED GRAPHENE NANO-SENSORS SUITABLE FOR LARGE SCALE PRODUCTION

This application claims priority to U.S. Provisional Patent Application Ser. No. 61/506,678, entitled "DESIGN OF ULTRA-FAST SUSPENDED GRAPHENE NANO-SENSORS SUITABLE FOR LARGE SCALE PRODUCTION," filed on Jul. 12, 2011, the entire content of which is hereby incorporated by reference.

FIELD OF THE INVENTION

Embodiments of the present invention relate to a new device and methods for the large scale production of graphene nano-sensors. Embodiments of the present invention pave the way for practical technological applications of graphene-based chemical sensors for the real-time, ultra-fast sensing of single molecules.

BACKGROUND

Graphene has attracted intensive world-wide attention because of its fundamental and technological importance.[1-8] Single-molecule sensitivity was demonstrated[9] in graphene-based sensors by monitoring the Hall resistivity in a magnetic field, and a detection limit of the order of 1 part per billion (p.p.b) was estimated from longitudinal resistivity measurement at zero magnetic field. Such exceptional sensitivity is important for industrial, environmental and military monitoring, and thus has been attracting enormous interests from the research and industry communities.[10-42] However, despite the great potential of graphene as next-generation sensing device, there remains a major obstacle for its use in practical applications, which is the mass production of arrays of graphene sensors with a reliable and low cost method. Recently, steady progresses have been made on the production of graphene by the chemical vapor deposition (CVD) approach,[43-69] and since 2009 low-cost production of large-area single-layer graphene has been achieved by a CVD process on copper substrate.[43] Yet the underlying Cu substrate is heavily conducting, which renders the electronic contribution from graphene negligible. As a result, one usually adopts complicated transfer process to separate the copper substrate and the graphene, which posts enormous technical challenge for reliable production of large number of sensor arrays. There was a recent attempt on transfer-free batch fabrication of single layer graphene transistors via a low pressure (~11 Torr) CVD method.[70] Yet to the best of our knowledge there has been no report on batch fabrication of graphene sensors, in particular, with suspended device geometry.

In addition, ultrafast detection of short-time chemical exposure is critical for real-time monitoring of active (e.g. toxic) gases, so that an early warning signal can be provided in time for subsequent remedy actions. Graphene suspended from the substrate promises faster response and higher sensitivity by reducing the substrate interference. As previously reported,[71-76] suspended graphene demonstrates high carrier mobility exceeding $200,000$ $cm^2V^{-1}s^{-1}$, which corresponds to two orders of magnitude higher than that of non-suspended graphene (typically ~5000 $cm^2V^{-1}s^{-1}$).[9] The significant mobility increase by minimizing the detrimental substrate effects has led to important fundamental discovery of the fractional quantum Hall effect in suspended graphene,[71,72] but serious technical challenges[73-76] remain in the fabrication of such suspended graphene devices and prevent further work in exploring its practical applications.

The present invention overcomes the above-mentioned limitations and allows for the large production of arrays of suspended graphene sensors by combining low cost ambient pressure CVD process with standard nano-fabrication techniques. The resulting suspended graphene nanosensors take advantage of their high carrier mobility to achieve ultrafast molecule detection and to assess the dynamical sensing response on the nano-second time scale. Ultrafast electronic circuits, statistical analysis and first principles simulations are also used to query the dynamical interaction between target molecules and suspended graphene.

SUMMARY

The present invention relates to a graphene nano-sensor, comprising a suspended graphene flake. In one embodiment, the graphene nano-sensor comprises a Si wafer, a thermal oxide layer coating the Si wafer, two Cr supporting pads disposed on top of the Si wafer with a gap between them, two Cu pads disposed on top of the Cr supporting pads with a Cu strip connecting them, and a graphene flake suspended one the Cu pads. The graphene flake is electrically connected to two metal electrodes.

In another embodiment, the present invention relates to a method for sensing single molecules, comprising running an electrical current through the graphene flake in a graphene nanosensor.

BRIEF DESCRIPTION OF THE DRAWINGS

The invention can be better understood with reference to the following detailed description together with the illustrative drawings.

FIG. 9(*a*)-(*c*). Drain-source current $I_{DS}$ at room temperature as a function of time with different gate voltages for a carbon nanotube transistor. (d) Logarithmic-scale plot of the probability ratio between the upper and the lower level ($P_1/P_2$) as a function of gate voltage. [Peng et al., Ref.[79]]

DETAILED DESCRIPTION

Embodiments of the present invention relate to a new device and methods for the large scale production of graphene nano-sensors. Embodiments of the present invention pave the way for practical technological applications of graphene-based chemical sensors for the real-time, ultra-fast sensing of single molecules.

A unique property of the present invention is the use of a suspended graphene layer as sensing element, that is where the graphene layer does not need to be supported by a substrate. By contrast, conventional sensors using graphene rely on the use of a substrate (such as silicon dioxide) for support, and such configuration suffers from serious limitations including interferences from the substrate material itself, making the sensing ineffective. In fact, when the graphene layer is sitting on top of a substrate, charge impurities and surface phonons from such substrate are found to be the dominating extrinsic sources for electron scattering in monolayer graphene.[8,80] To this day, this represents a serious limitation for the use of graphene as sensing element and particularly in the case of ultrafast sensing applications.

The operational principle of suspended graphene sensors relies on the fast response of the electrical conductivity to the adsorption of molecules on the surface of suspended graphene. Such an electronic response can be induced by either carrier doping or mechanical stress due to the adsorption events.

Figure 4:
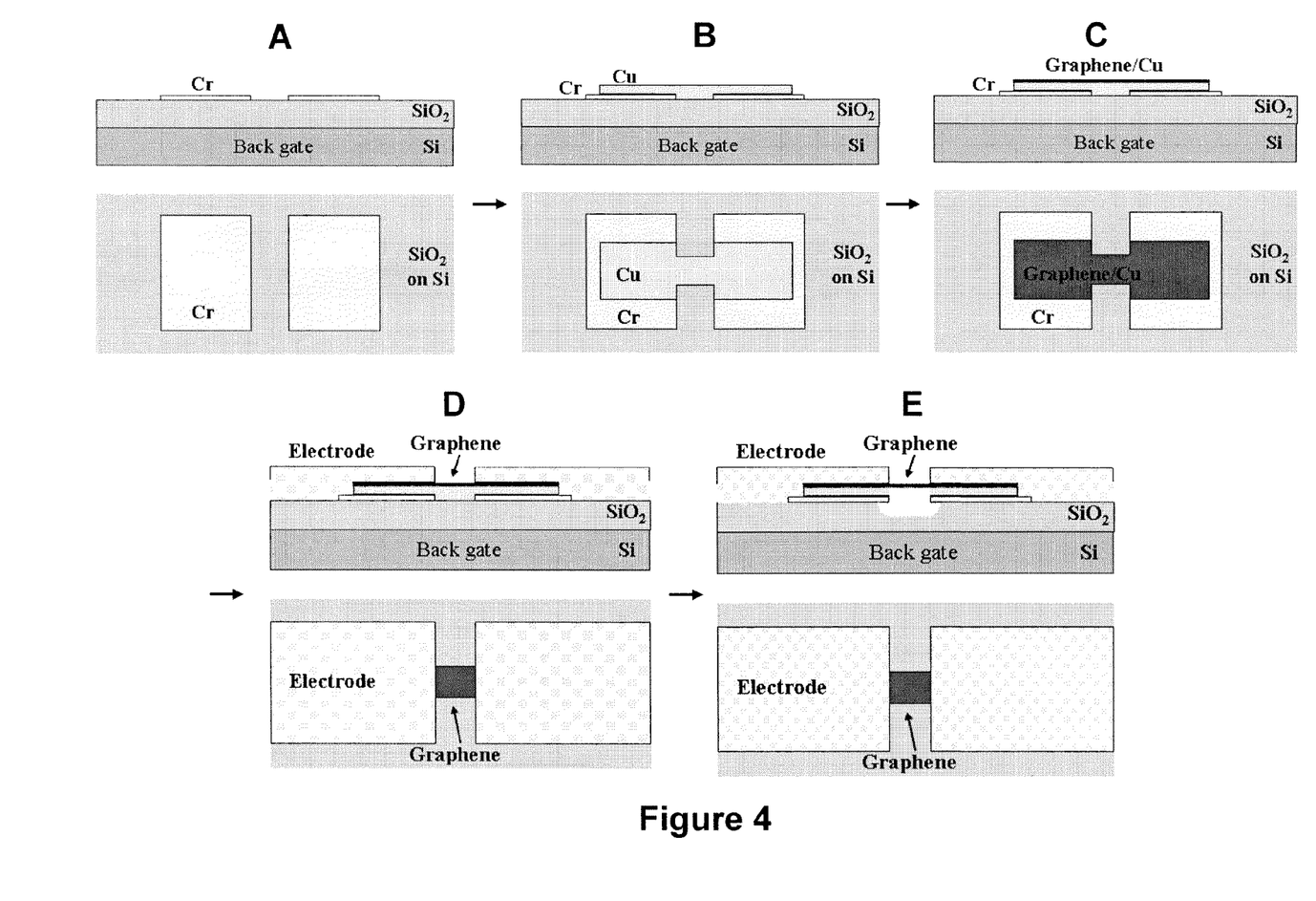
FIG. 4. Diagrams for device fabrication of suspended graphene sensors. In each diagram, the upper panel is a cross-sectional view and the lower is a top view of the proposed device.

Embodiments of the present invention provide methods for the fabrication of a device using suspended graphene flakes as sensing element. A flake is defined as a quasi-two-dimensional thin film made of a number of graphitic layers (e.g., ranging from one layer to a thousand layers). Such flakes can be composed of either a single layer of graphene or multilayers depending on methane flow used during the CVD process. Such suspended device geometry is important for achieving ultrafast, real time detection of chemicals. The experimental steps undertaken for the fabrication of such device are illustrated in FIG. 4. The starting material consists of a degenerately doped Si wafer coated with a top thermal oxide layer about 10 nm to 5000 nm thick, preferably 500 nm thick. Alternatively, the top layer can also be made of a combination of silicon dioxide or other insulators such as silicon nitride, aluminum oxide, etc. Through e-beam lithography and lift-off processes, two supporting pads (e.g. chromium pads of about 0.5×0.5 µm to 1000 µm×1000 µm, preferably about 10 µm×10 µm, in lateral dimensions and from about 0.5 nm to 500 nm, preferably about 20 nm, in thickness) are patterned on the $SiO_2$ layer with a gap (e.g. about 50 nm to 50 µm wide, typically 1 µm wide) between them, as shown in FIG. 4*a*. The supporting pads serve as sticky layers and protection layers in a later buffered HF etching step. Subsequently, two Cu pads (about 50 nm to 5000 nm thick, preferably about 500 nm thick) are patterned on top, with a narrow Cu strip connecting them, as illustrated in FIG. 4*b*. The Cu pads serve as the catalyst layer for the CVD growth of graphene at the designed locations in the next step, as shown in FIG. 4*c*. Then two metal electrodes (e.g. Pd/Cr) are patterned on top to electrically connect the graphene flake, as illustrated in FIG. 4*d*. Next, buffered HF etch is used to remove part of the silicon dioxide layer, immediately followed by a Cu etching (e.g. with iron nitrate or $FeCl_3$ solution) to obtain the final suspended graphene device, as shown in FIG. 4*e*. Note that the selected metal electrodes (Pd/Cr) and the supporting pads (Cr) are unaffected by the etching process, and that the graphene/Cu part sandwiched between them are then protected, leaving only the exposed graphene strip suspended as the sensing element, as depicted in FIG. 4*e*. The sandwiched graphene/Cu parts enhance the mechanical strength of the device and improve the electrical contacts between electrodes and the suspended graphene strip. The suspended graphene layers are purposely positioned at designed locations, electrically bridging source and drain electrodes for sensing applications. A representative three-terminal device scheme is shown in FIG. 4*e* (with the doped silicon substrate as a back gate), where the suspended graphene flake serves as the sensing element. When gas molecules are adsorbed on the suspended graphene flake, the introduced carrier doping or mechanical stress results in a change of the electrical conductance of the device. The real-time sensing of single molecules is then monitored by the change in the electrical current flow through the graphene flake. A back gate voltage is applied to tune the carrier density in graphene for optimizing the sensitivity. For optimum performance, the device geometry and thickness of the suspended graphene flake are varied, typically from sub-microns to a few microns in width and length.

Figure 1:
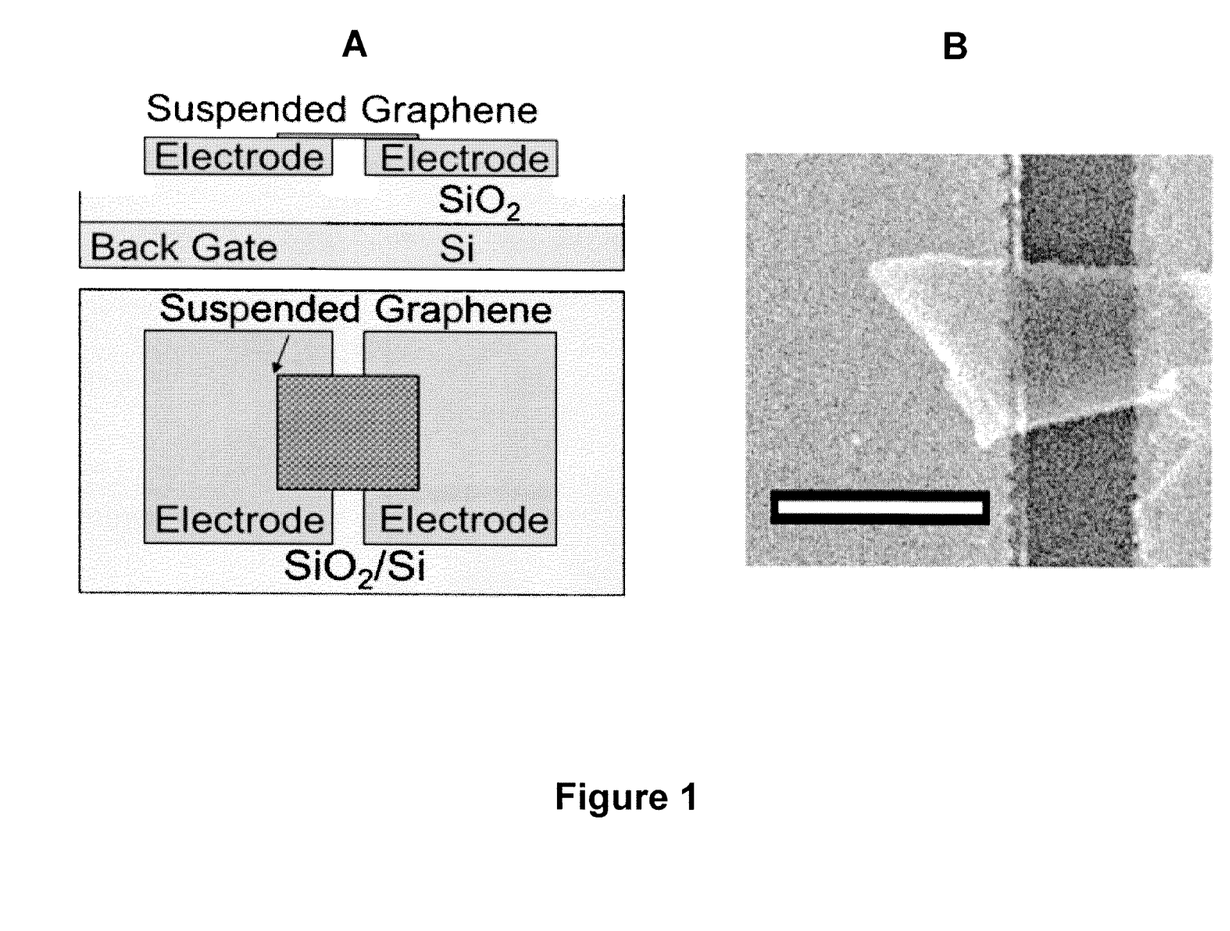
FIG. 1. (a) Cross section (upper panel) and top view (lower panel) of the device geometry illustrating a suspended graphitic flake. (b) Scanning electron microscope image of a typical device. Scale bar: 1 μm. [Ref.[77]]
Figure 2:
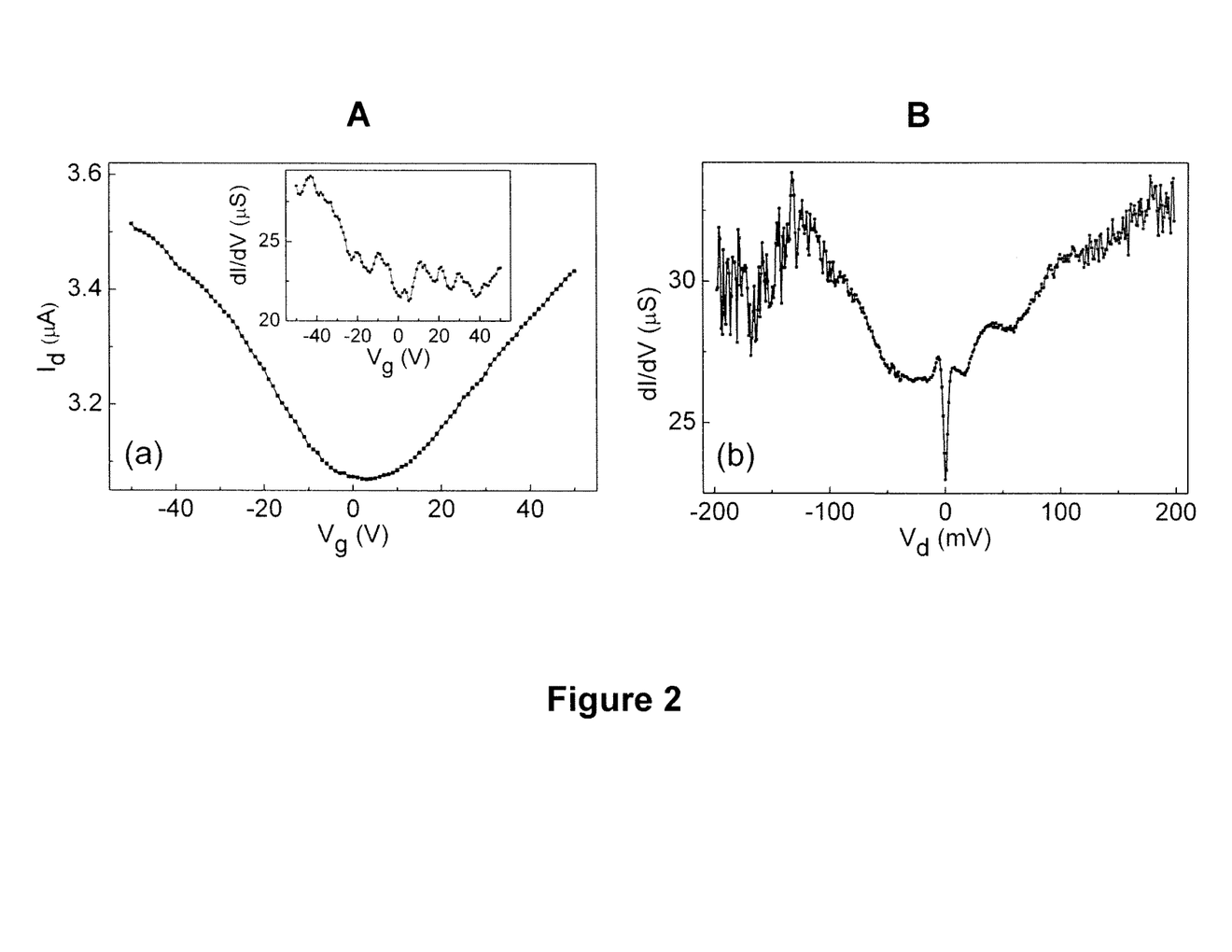
FIG. 2. (a) Drain source current $I_d$ vs. gate voltage $V_g$ under a DC bias $V_d$100 mV (Inset: differential conductance dI/dV vs. $V_g$ at $V_d$=0), and (b) dI/dV vs. $V_d$ with $V_g$=0 at T=4.2 K for a suspended graphene multilayer. For the gate tuning of dI/dV, reproducible oscillations are observed, which can be related to the Fabry-Perot interference of electron waves confined between the source and drain. [Ref.[78]]
Figure 3:
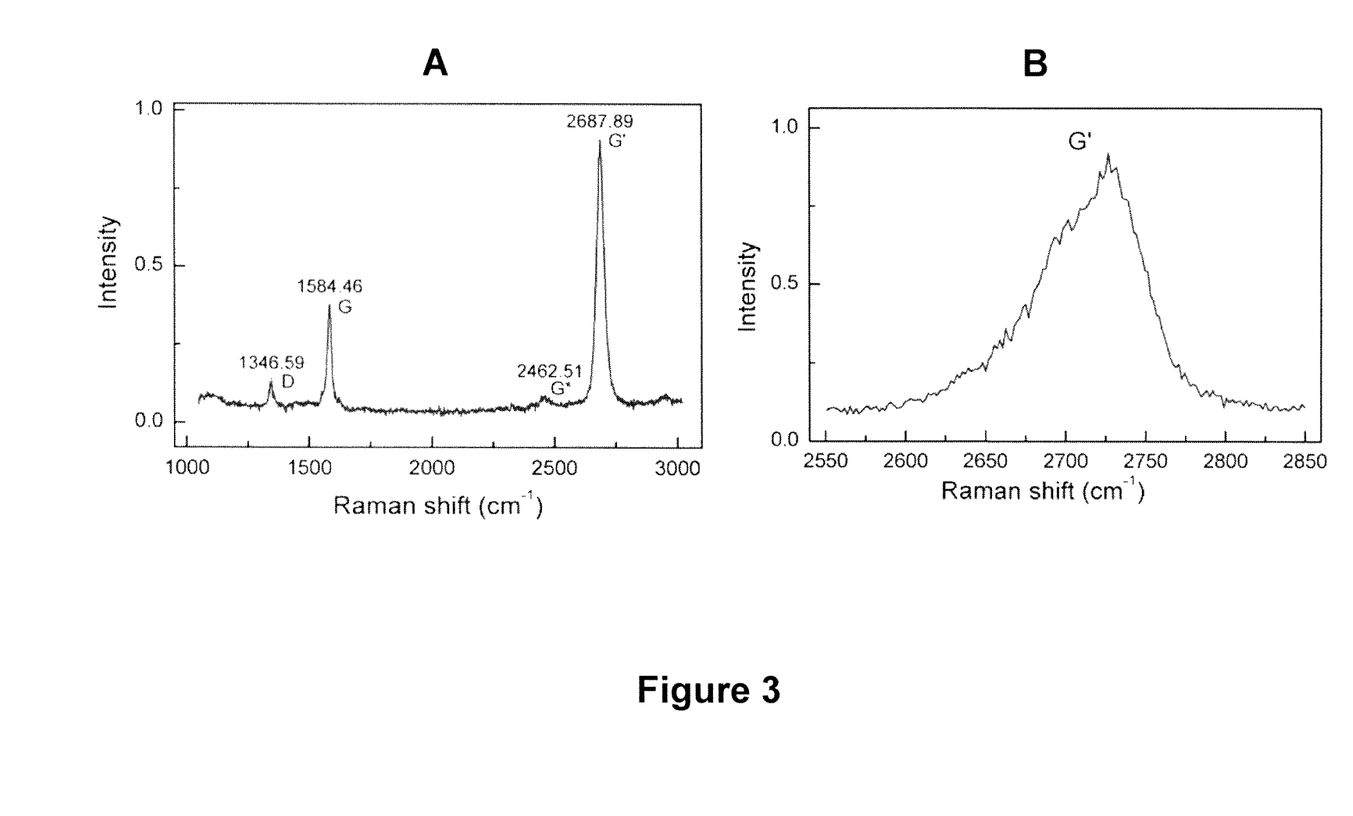
FIG. 3. Raman spectrum for (a) single-layer graphene; and (b) few-layer graphene (showing a characteristic asymmetric G' peak for AB stacking) produced by Cu-based CVD growth under ambient pressure.

Other embodiments of the present invention disclose actual measurements on the fabricated device. More specifically, FIG. 1A depicts a cross section (upper panel) and top view (lower panel) of the final device geometry illustrating a suspended graphene flake. FIG. 1B is an actual image of a typical device obtained from scanning electron microscope (scale bar corresponds to 1 µm). FIG. 2 describes the hot electron transport behavior where in (a) the drain source current $I_d$ vs. gate voltage $V_g$ under a DC bias $V_d$=100 mV (Inset: differential conductance dI/dV vs. $V_g$ at $V_d$=0), and in (b) dI/dV vs. $V_d$ with $V_g$=0 at T=4.2 K for a suspended graphene multilayer. For the gate tuning of dI/dV, reproducible oscillations are observed, which can be related to the Fabry-Perot interference of electron waves confined between the source and drain. Ion beam implantation was also explored to tailor the electronic properties of graphene layers.[84] FIG. 3A is the Raman spectrum of the device and FIG. 3B depicts the first-principles simulation of the interaction between molecules and graphene. The Raman spectrum shows a G-to-G' intensity ratio ~0.5, a symmetric G' band centered at ~2687.9 $cm^{-1}$ with a full width at half maximum of ~34 $cm^{-1}$, typical for single layer graphene as reported in the literature.[43] By increasing the methane flow to 13 sccm, few-layer graphene with AB stacking sequence are obtained and are characterized by an asymmetric G' peak (such as shown in FIG. 3B). This is to be differentiate from turbostratic few-layer graphene, typically produced with the low-pressure CVD settings suggested in literature, with rotationally random stacking which shows a broadened symmetric G' peak.[81]

Another preferred embodiment of the present invention relates to methods for the surface modification of suspended graphene sensors to achieve the selective sensing of chemicals of interest. This is done using one of two approaches by either (1) the thermal evaporation of small amounts of inorganic materials to decorate the graphene surface; or (2) the functionalization of the graphene surface with organic molecules, depending on the type of sensors that is needed—some require the selective binding to inorganic substrates, while other require the selective binding to organic substrates.

In the first approach, the underlying concept is to create impurity sites on pristine graphene, which have been suggested for effective binding to gas molecules.[34,82-84] The present invention makes use of tools for thin-film deposition of sensing molecules to decorate suspended pure graphene layers with inorganic materials (FIG. 5), and therefore to create suspended hybrid sensing nanostructures. Inorganic materials include but are not limited to Pd, $B_4C$, CdS, Ti, Au and Al. Palladium has been known as a good hydrogen sensor,[85] and is of particular interest to investigate Pd/graphene as $H_2$ gas sensor. Doping with Al appears to increase the local activity due to lattice deformation[34,86] and binds general molecules except $H_2$. Boron and sulfur doping are known for binding $NO_2$ and NO gases, two polluting gases that are generally monitored when assessing air quality. Of particular interest is that isotropic buffered HF etching creates an undercut beneath the metal electrodes in FIG. 4e, which prevents parasitic conduction path in the case where a thin layer (~1 nm) of conducting materials is deposited on top of suspended graphene flakes.

Figure 5:
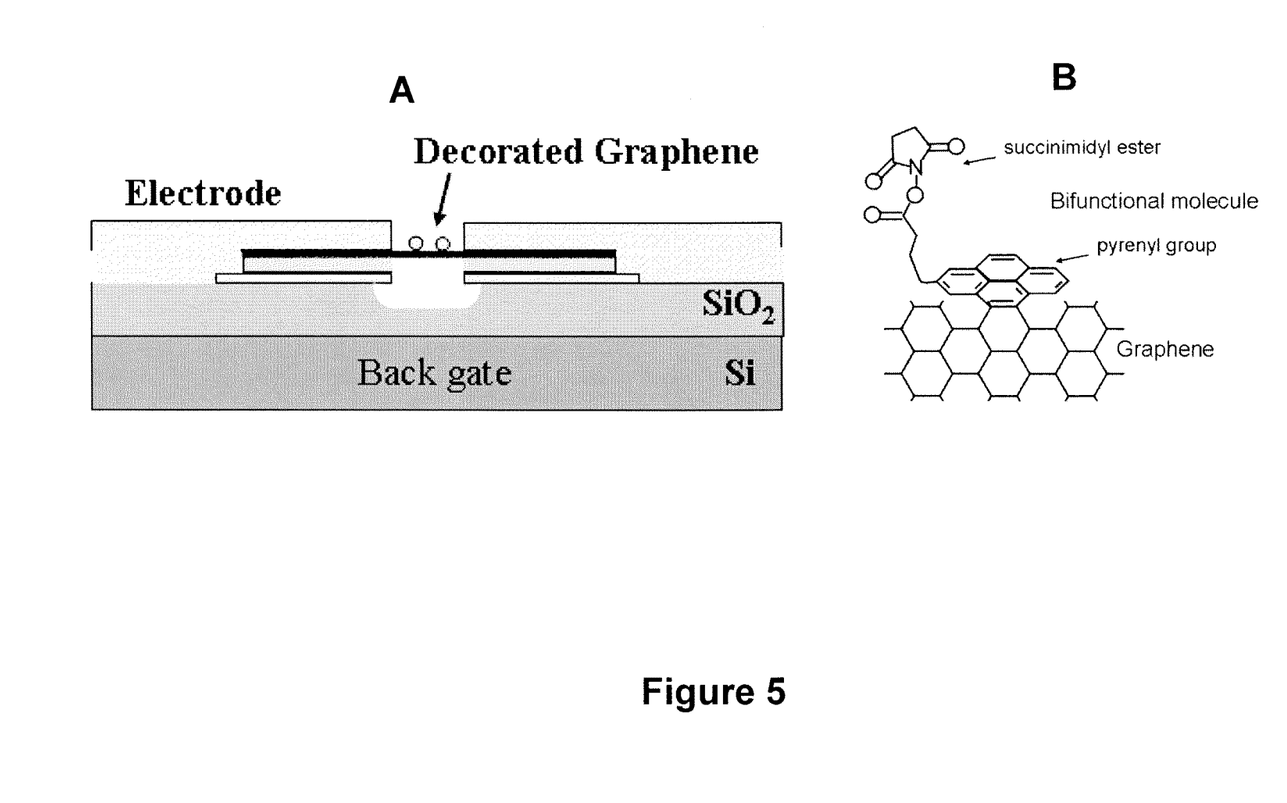
FIG. 5. (a) Suspended graphene decorated with impurity atoms for gas molecule binding. (b) Non-covalent functionalization of graphene surface with a bifunctional molecule, 1-Pyrenebutanoic Acid, Succinimidyl Ester (1). The pyrenyl group is anchored to the graphene via π-stacking and leaves the dangling succinimidyl ester group for binding to target chemicals (e.g. the amine group).

In the second approach, the underlying concept is to functionalize the graphene surface with organic molecules for specific binding to target molecules. Examples include DNA and a bifunctional molecule, 1-Pyrenebutanoic Acid, Succinimidyl Ester, and a layer of native hemin molecules, as illustrated in FIG. 5b. The pyrenyl group interacts strongly with graphite basal plane[87] and carbon nanotube side wall via π-stacking[88-90] and thus is able to non-covalently functionalize the graphene surface. The anchored succinimidyl ester reacts with other chemical groups (e.g., the amine group) and thus provides specific bindings to selected chemicals. Another example is the functionalization of the graphene surface by attaching a layer of native hemin molecules and this can be used to selectively detect NO gas.

Figure 6:
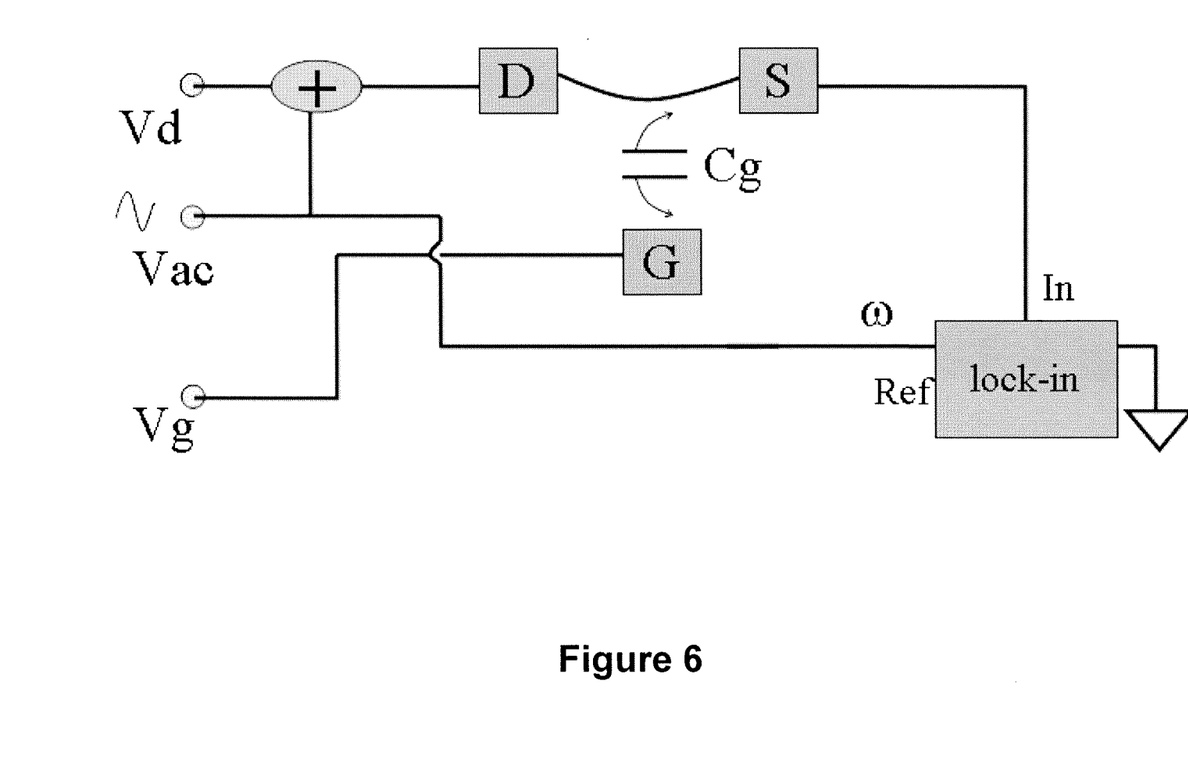
FIG. 6. Measurement set up for differential conductance (dI/dV) spectroscopy. A DC voltage Vd and a small AC voltage Vac at low frequency ω are applied at the drain (D), while a DC voltage Vg is sent to the gate (G). A lock-in amplifier monitors the drain-source current flow at the frequency ω and enables the mapping of dI/dV as a function of both Vd and Vg.

Other embodiments of the present invention relates to a method for the characterization of electron transport at high drain-source bias $V_d$ in the three-terminal sensing device. Such configuration is illustrated in FIG. 4e, which corresponds to a configuration as a field effect transistor. Besides standard characterization of FET devices such as I-V curves and transfer characteristics, the electron transport in the graphene flake is explored by dI/dV spectroscopy as a function of gate voltage $V_g$ and source drain bias $V_d$ following the schematics in FIG. 6 where $V_g$ is explored to tune the Fermi level of the graphene layers by modulating the carrier density, while $V_d$ is applied to inject hot electrons and enable the probing of dI/dV response at electronic states above the Fermi level. Such characterization provides important information on the field effect carrier mobility which is then used to define the best operation conditions (such as Vg and $V_d$ values) for sensing purposes. In addition, low-temperature transport experiments are carried out in order to establish material quality and to identify the dominating sources of scattering, which includes but are not limited to phonons or impurities.

Figure 7:
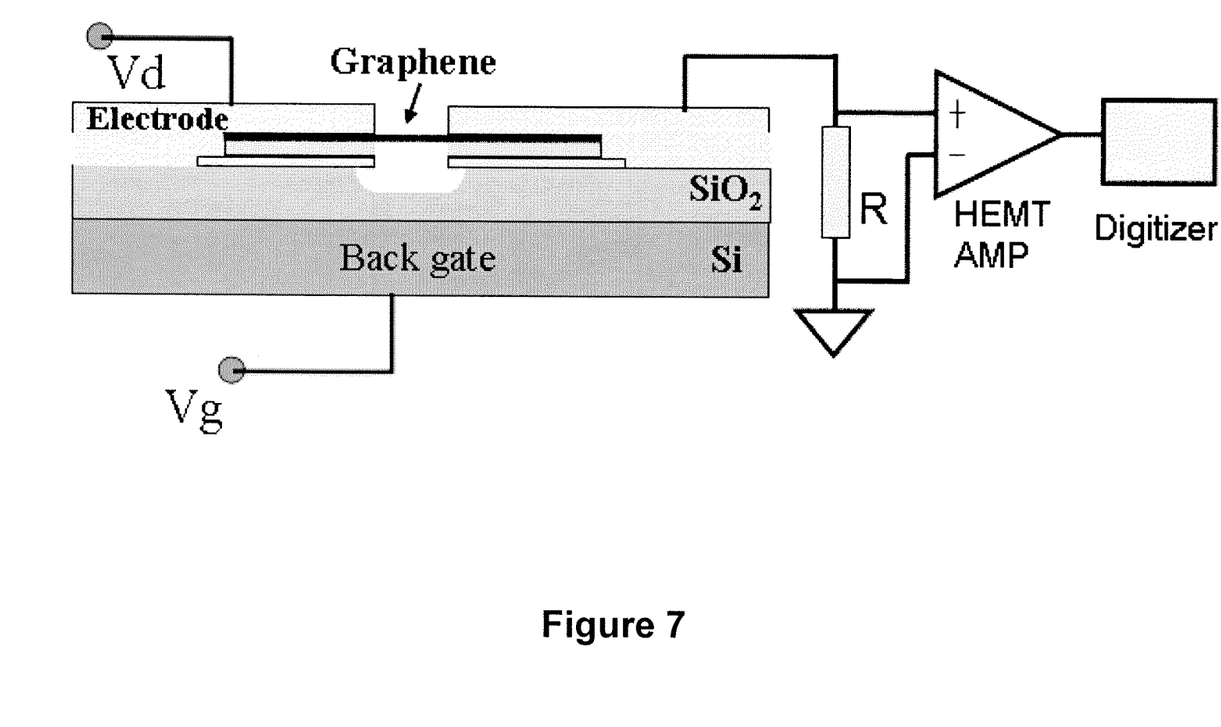
FIG. 7. Schematics of the noise detection circuit for suspended graphene sensor.

Other embodiments of the present inventions discloses a method for the characterization of noise level of the suspended sensor by monitoring the current fluctuation using the detection circuit shown in FIG. 7. Such system is also used for real-time sensing circuit. In this configuration, source drain current fluctuation is converted to voltage fluctuation through a resistor R, which is subsequently amplified by a high electron mobility transistor (HEMT) and recorded by a high-frequency digitizer (with a bandwidth from DC to 1 GHz). The digitized data is processed by fast Fourier transform (FFT) and provides detailed noise information for the experimental conditions with different gate voltage $V_g$ and drain-source bias $V_d$. Noise at temperatures from room temperature to 270 mK are used for characterizing the contribution from Johnson noise, shot noise and 1/f noise in suspended graphene sensors.

Figure 8:
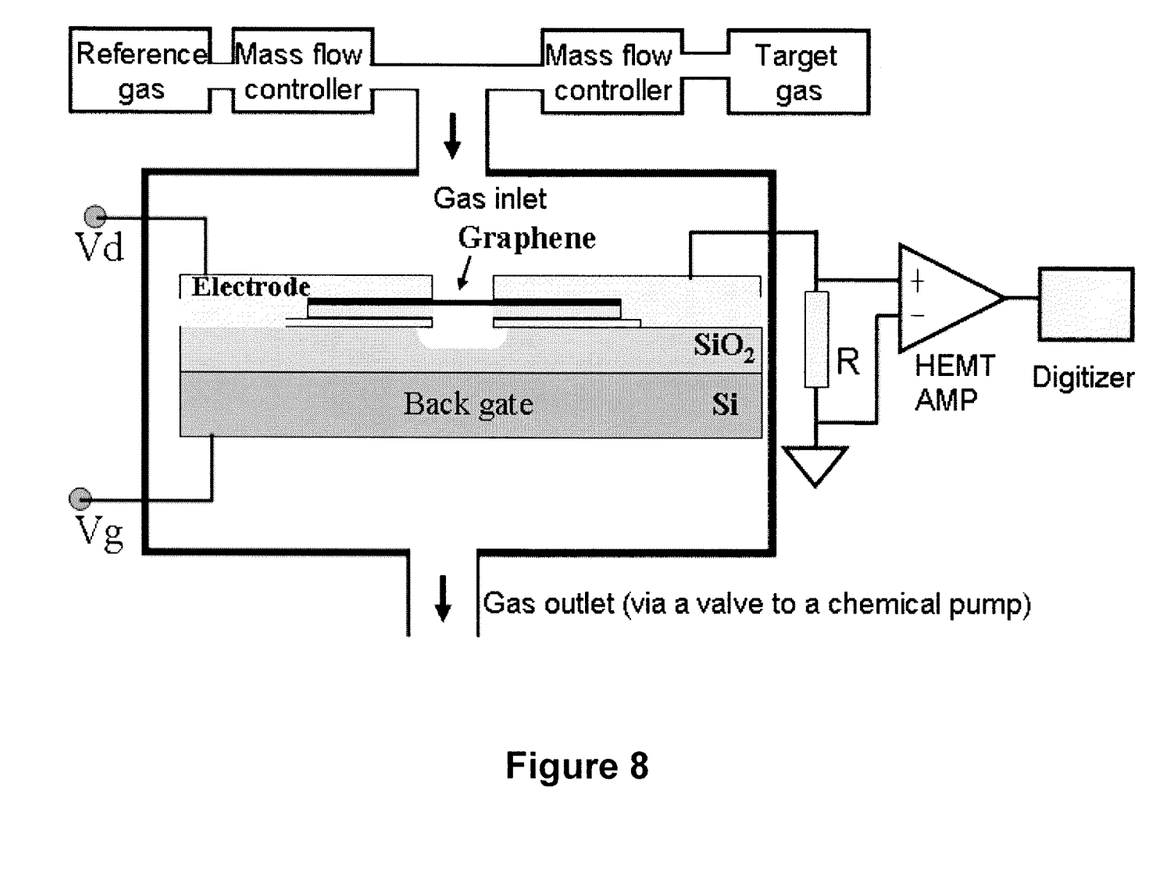
FIG. 8. Schematics of the gas sensing apparatus with electrical feedthroughs and gas flow control.

Other embodiments of the present invention disclose a method for the ultrafast sensing of gas molecules using pristine and decorated suspended graphene devices. To achieve this, a gas sensing chamber such as depicted in FIG. 8 is used. This chamber consists of a small stainless steel container of about one liter in volume comprising also electrical feedthroughs, a gas inlet port and outlet ports. The electrical response of the graphene to the gas environment is monitored using the circuit illustrated in FIG. 7. A typical digital sampling rate is 2 GS/s, enabling the detection of dynamical response in a time resolution of nanoseconds. The reference gas is used such as for example an inert gas like pure nitrogen or helium gas. The target gas is a mixture of a selected chemical diluted in the inert reference gas, e.g., with a concentration in the order of 1 part per million. In its simplest form, target gas molecules include $H_2$, $O_2$, $NO_2$, NO, $NH_3$ or $H_2O$. The detection procedure includes the following process: 1) Pump and flush the gas chamber with the reference gas; 2) Start the monitoring of electrical current flow through the graphene sensor with optimized gate voltage $V_g$ and drain-source voltage $V_d$, and trigger the target gas flow via a mass flow controller; 3) Stop the target gas flow, pump and flush the chamber with the reference gas; 4) Regenerate the suspended graphene sensor by electrical current annealing (with a current density ~1 mA/μm) to remove any residue target gas molecules so that the device is ready for the next sensing cycle. This fourth step is important for practical operation of graphene sensor in order to provide fast and convenient desorption of gas molecules. Previously,[9] heating at a temperature of about 50° C. has been used for the recovery process. With suspended device geometry such as the suspended graphene flake, current annealing can be used for the removal of adsorbed gas residues and renders the device ready for next cycle of sensing. Graphene has extraordinary current-carrying capability and a current density ~mA/μm is easily achieved for annealing purpose in single-layer graphene.[91]

Other embodiments of the present invention discloses a method to extract information on the target molecules such as the absorption probability and the collision probability. This is enabled by ultrafast data sampling with a typical bandwidth ~1 GHz (or even in the order of 10 GHz) using the configuration illustrated in FIG. 8 which allows for the monitoring of the baseline shift and the recordation of current fluctuation due to sensing of the gas by the graphene layer. Such current fluctuation may encode information specific to the target gas molecules, such as but not limited to the absorption probability and the collision probability. The raw data is the recorded electrical current as a function of time and noise spectrum analysis is conducted in the frequency domain. This is achieved by measuring raw data by FFT and by subsequently analyzing the noise spectrum caused by the introduction of the target gas molecules. Of particular interest is the 1/f noise. In field effect transistors, charge fluctuation near the conduction channel introduces random telegraph noise in the drain-source current, e.g. in narrow-channel Si MOSFET[92] and carbon nanotube FET (FIG. 9).[79] Superposition of random telegraph noise at different transition rate has been suggested as an origin of 1/f noise in field effect transistor. For graphene sensor (or a type of field effect transistors), gas molecules near the graphene should induce random telegraph signal via their interaction with graphene. Therefore, the 1/f noise may encode specific information related to the target molecules. With the above-mentioned considerations, an understanding of the correlations between the noise characteristics and the type of gas molecules is valuable.

Figure 9:
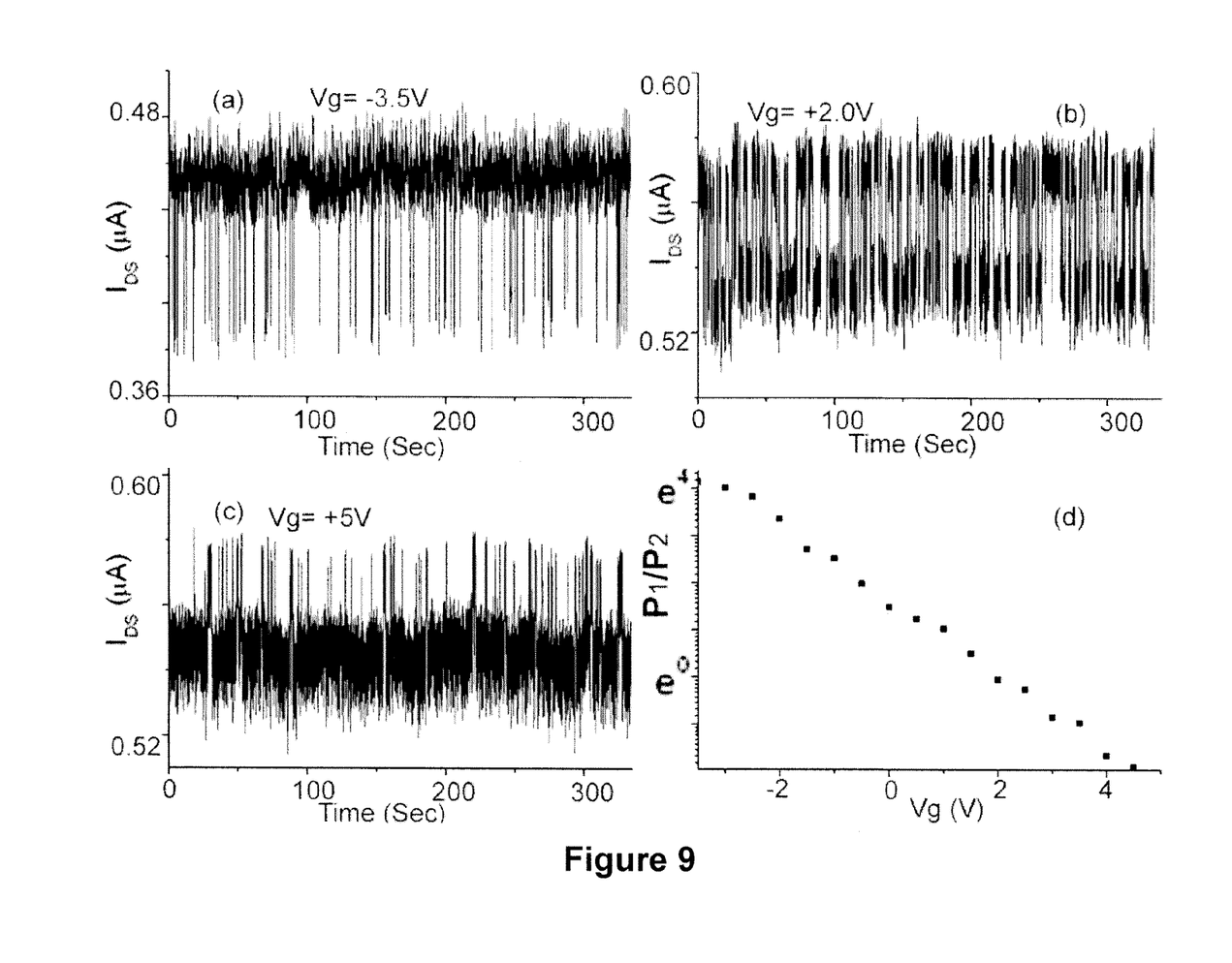
Figure 10:
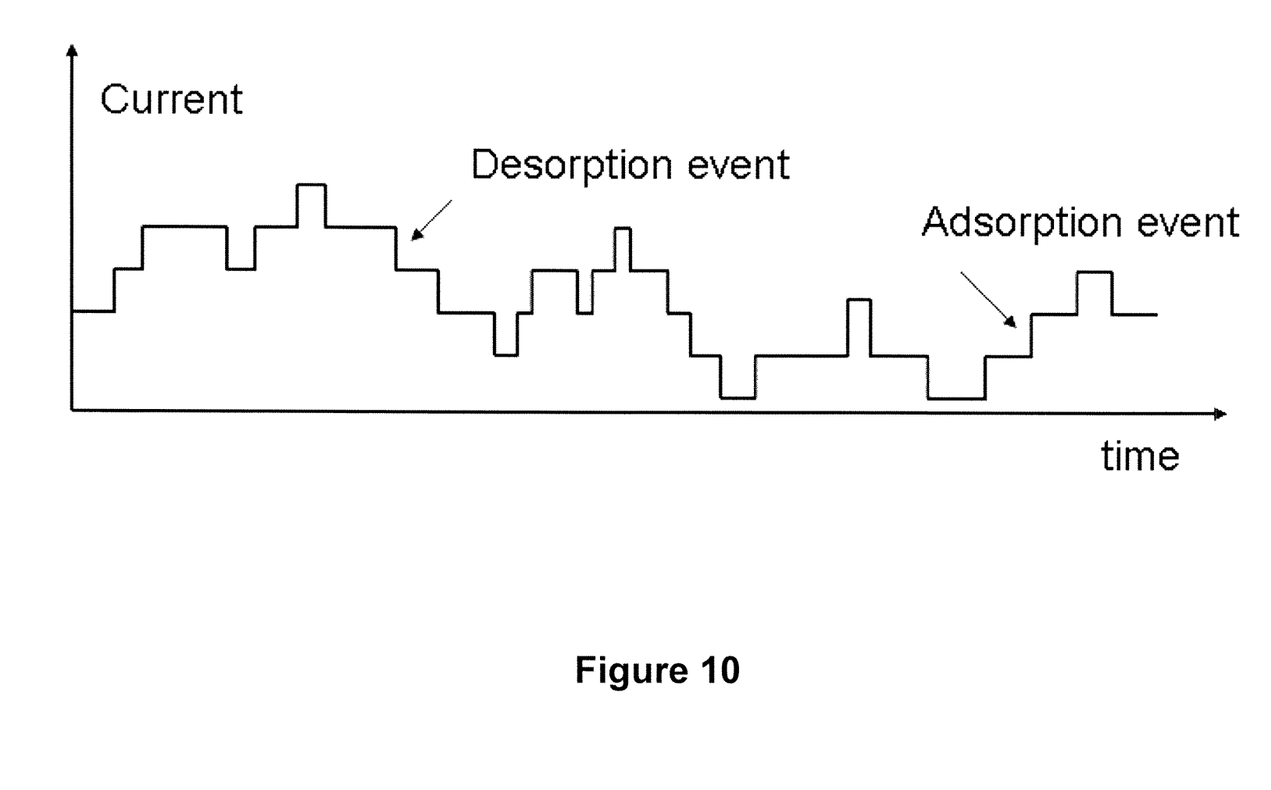
FIG. 10. Schematics of random telegraph signal due to multiple adsorption (desorption) events where it is assumed that each adsorption (desorption) event induces an increasing (decreasing) current step. (This assumption is reasonable since the jumping direction of the current due to adsorption events should be fixed for a given type of molecules.)

Other embodiments of the present invention relates to a method for the determination of the adsorption rate and the desorption rate. In that case, current fluctuations induced by the gas molecules are recorded in the time domain. Previous work[79] on carbon nanotube FET has shown that the charge fluctuation near the conduction channel can lead to discrete current levels due to individual charge transfer events such as illustrated in FIG. 9, and the probability of the duration for such discrete level is tunable by the gate voltage. However, in Ref.[79], the current fluctuation was only monitored in the time scale of millisecond. For suspended graphene sensors, the interaction between the gas molecules and the graphene may introduce current fluctuations that can be captured by the ultrafast detection circuit (with sampling time in the order of nanosecond) as depicted in FIG. 8. In the case where the adsorption of gas molecules to graphene follows a Poissonian process, the adsorption rate or desorption rate can be extracted by analyzing the probability of the width of the current fluctuation steps. Since the identification of the statistical characteristics associate with different gases becomes possible and is valuable for the purpose of selective sensing. A possible current fluctuation for graphene sensors is illustrated in FIG. 10 where adsorption and desorption events are identifiable and their rate can be determined as follows. In a Poissonian process with an adsorption rate (i.e. probability per unit time) $\lambda$, the probability for an individual gas molecule to be adsorbed to the graphene surface within a small time interval between t to t+$\Delta$t is P=$\lambda\Delta$t $e^{-\lambda t}$. For a fixed small $\Delta$t, ln P should be linearly dependent on t with a slope $-\lambda$. If each adsorption event leads to a discrete stepwise current jump (FIG. 10), the number of such steps with a width between t to t+$\Delta$t is proportional the relevant adsorption probability P mentioned above. Therefore, the adsorption rate can be conveniently extracted from the logarithmic plot of the number of steps with a width between t and t+$\Delta$t.[79] By the same token, the desorption rate can be extracted. On the other hand, by choosing a fixed time interval $\delta$t covering a few events on average (FIG. 10) and treating the number of adsorption events within $\delta$t as a random variable x, we can also extract the adsorption rate by a fitting to the Poisson distribution:

$$P(x=n)=e^{-\lambda\delta t}(\lambda\delta t)^n/n!, n=0,1,2\ldots$$

This teaches that the adsorption (desorption) phenomena should be a dynamical process after the gas exposure. At the beginning stage after the exposure, more adsorption than desorption events are expected, while they should be balanced after saturation (or in equilibrium). Therefore, the adsorption (desorption) rate at both the beginning stage and the saturation stage ought to be assessed.

While the invention described herein specifically focuses on a new device and method for the ultrafast detection of single molecule in real time using suspended graphene flakes as sensor, one of ordinary skills in the art, with the benefit of this disclosure, would recognize the extension of such approach to other systems.

All references cited herein are incorporated by reference. Although the invention has been disclosed with reference to its preferred embodiments, from reading this description those of skill in the art may appreciate changes and modification that may be made which do not depart from the scope and spirit of the invention as described above and claimed hereafter. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee.

REFERENCES CITED

The following references, to the extent that they provide exemplary procedural or other details supplementary to those set forth herein, are specifically incorporated herein by reference.

NON-PATENT DOCUMENTS

1. Novoselov, K. S., Geim, A. K., Morozov, S. V., Jiang, D., Zhang, Y., Dubonos, S. V., Grigorieva, I. V. & Firsov, A. A. Electric field effect in atomically thin carbon films. *Science* 306, 666-669 (2004).
2. Novoselov, K. S., Geim, A. K., Morozov, S. V., Jiang, D., Katsnelson, M. I., Grigorieva, I. V., Dubonos, S. V. & Firsov, A. A. Two-dimensional gas of massless Dirac fermions in graphene. *Nature* 438, 197-200 (2005).
3. Zhang, Y. B., Tan, Y. W., Stormer, H. L. & Kim, P. Experimental observation of the quantum Hall effect and Berry's phase in graphene. *Nature* 438, 201-204 (2005).
4. Berger, C., Song, Z. M., Li, T. B., Li, X. B., Ogbazghi, A. Y., Feng, R., Dai, Z. T., Marchenkov, A. N., Conrad, E. H., First, P. N. & de Heer, W. A. Ultrathin epitaxial graphite: 2D electron gas properties and a route toward graphene-based nanoelectronics. *Journal of Physical Chemistry B* 108, 19912 (2004).
5. Geim, A. K. & Novoselov, K. S. The rise of graphene. *Nature Materials* 6, 183-191 (2007).
6. Berger, C., Song, Z. M., Li, X. B., Wu, X. S., Brown, N., Naud, C., Mayou, D., Li, T. B., Hass, J., Marchenkov, A. N., Conrad, E. H., First, P. N. & de Heer, W. A. Electronic confinement and coherence in patterned epitaxial graphene. *Science* 312, 1191-1196 (2006).
7. Geim, A. K. Graphene: Status and Prospects. *Science* 324, 1530-1534 (2009).
8. Castro Neto, A. H., Guinea, F., Peres, N. M. R., Novoselov, K. S. & Geim, A. K. The electronic properties of graphene. *Reviews of Modern Physics* 81, 109-162 (2009).
9. Schedin, F., Geim, A. K., Morozov, S. V., Hill, E. W., Blake, P., Katsnelson, M. I. & Novoselov, K. S. Detection of individual gas molecules adsorbed on graphene. *Nature Materials* 6, 652-655 (2007).
10. Ang, P. K., Chen, W., Wee, A. T. S. & Loh, K. P. Solution-Gated Epitaxial Graphene as pH Sensor. *Journal of the American Chemical Society* 130, 14392 (2008).
11. Ao, Z. M., Yang, J., Li, S. & Jiang, Q. Enhancement of CO detection in Al doped graphene. *Chemical Physics Letters* 461, 276 (2008).
12. Huang, B., Li, Z. Y., Liu, Z. R., Zhou, G., Hao, S. G., Wu, J., Gu, B. L. & Duan, W. H. Adsorption of gas molecules on graphene nanoribbons and its implication for nanoscale molecule sensor. *Journal of Physical Chemistry C* 112, 13442 (2008).

13. Mohanty, N. & Berry, V. Graphene-Based Single-Bacterium Resolution Biodevice and DNA Transistor: Interfacing Graphene Derivatives with Nanoscale and Microscale Biocomponents. *Nano Letters* 8, 4469 (2008).
14. Moradian, R., Mohammadi, Y. & Ghobadi, N. Investigation of gas sensing properties of armchair graphene nanoribbons. *Journal of Physics-Condensed Matter* 20, 425211 (2008).
15. Qazi, M. & Koley, G. NO2 Detection Using Microcantilever Based Potentiometry. *Sensors* 8, 7144 (2008).
16. Rosales, L., Pacheco, M., Barticevic, Z., Latge, A. & Orellana, P. A. Transport properties of graphene nanoribbons with side-attached organic molecules. *Nanotechnology* 19, 065402 (2008).
17. Sakhaee-Pour, A., Ahmadian, M. T. & Vafai, A. Potential application of single-layered graphene sheet as strain sensor. *Solid State Communications* 147, 336 (2008).
18. Sakhaee-Pour, A., Ahmadian, M. T. & Vafai, A. Applications of single-layered graphene sheets as mass sensors and atomistic dust detectors. *Solid State Communications* 145, 168 (2008).
19. Wehling, T. O., Novoselov, K. S., Morozov, S. V., Vdovin, E. E., Katsnelson, M. I., Geim, A. K. & Lichtenstein. A. I. Molecular doping of graphene. *Nano Letters* 8, 173 (2008).
20. Ao, Z. M., Li, S. & Jiang, Q. Thermal stability of interaction between the CO molecules and the Al doped graphene. *Physical Chemistry Chemical Physics* 11, 1683 (2009).
21. Arsat, R., Breedon, M., Shafiei, M., Spizziri, P. G., Gilje, S., Kaner, R. B., Kalantar-Zadeh, K. & Wlodarski, W. Graphene-like nano-sheets for surface acoustic wave gas sensor applications. *Chemical Physics Letters* 467, 344 (2009).
22. Chi, M. & Zhao, Y. P. Adsorption of formaldehyde molecule on the intrinsic and Al-doped graphene: A first principle study. *Computational Materials Science* 46, 1085 (2009).
23. Dan, Y. P., Lu, Y., Kybert, N. J., Luo, Z. T. & Johnson, A. T. C. Intrinsic Response of Graphene Vapor Sensors. *Nano Letters* 9, 1472 (2009).
24. Fowler, J. D., Allen, M. J., Tung, V. C., Yang, Y., Kaner, R. B. & Weiller, B. H. Practical Chemical Sensors from Chemically Derived Graphene. *Acs Nano* 3, 301 (2009).
25. Ghosh, A., Late, D. J., Panchakarla, L. S., Govindaraj, A. & Rao, C. N. R. NO2 and humidity sensing characteristics of few-layer graphenes. *Journal of Experimental Nanoscience* 4, 313 (2009).
26. Kaniyoor, A., Jafri, R. I., Arockiadoss, T. & Ramaprabhu, S. Nanostructured Pt decorated graphene and multi walled carbon nanotube based room temperature hydrogen gas sensor. *Nanoscale* 1, 382 (2009).
27. Li, H. J., Chen, J. A., Han, S., Niu, W. X., Liu, X. Q. & Xu, G. B. Electrochemiluminescence from tris(2,2'-bipyridypruthenium(II)-graphene-Nafion modified electrode. *Talanta* 79. 165 (2009).
28. Lu, G. H., Ocola, L. E. & Chen, J. H. Gas detection using low-temperature reduced graphene oxide sheets. *Applied Physics Letters* 94, 083111 (2009).
29. Ohno, Y., Maehashi, K., Yamashiro, Y. & Matsumoto, K. Electrolyte-Gated Graphene Field-Effect Transistors for Detecting pH Protein Adsorption. *Nano Letters* 9, 3318 (2009).
30. Tang, Z. W. DNA-graphene sensor seems possible. *Trac-Trends in Analytical Chemistry* 28, VIII (2009).
31. Wu, H., Wang, J., Kang, X. H., Wang, C. M., Wang, D. H., Liu, J., Aksay, I. A. & Lin, Y. H. Glucose biosensor based on immobilization of glucose oxidase in platinum nanoparticles/graphene/chitosan nanocomposite film. *Talanta* 80, 403 (2009).
32. Zhang, Y. H., Chen, Y. B., Zhou, K. G., Liu, C. H., Zeng, J., Zhang, H. L. & Peng, Y. Improving gas sensing properties of graphene by introducing dopants and defects: a first-principles study. *Nanotechnology* 20, 185504 (2009).
33. Lu, Y., Goldsmith, B. R., Kybert, N. J. & Johnson, A. T. C. DNA-decorated graphene chemical sensors. *Applied Physics Letters* 97, 083107 (2010).
34. Dai, J. Y., Yuan, J. M. & Giannozzi, P. Gas adsorption on graphene doped with B, N. Al, and S: A theoretical study. *Applied Physics Letters* 95, 232105 (2009).
35. Ao, Z. M., Li, S. & Jiang, Q. Correlation of the applied electrical field and CO adsorption/desorption behavior on Al-doped graphene. *Solid State Communications* 150, 680 (2010).
36. Brownson, D. A. C. & Banks, C. E. Graphene electrochemistry: an overview of potential applications. *Analyst* 135, 2768 (2010).
37. Garaj, S., Hubbard, W., Reina, A., Kong, J., Branton, D. & Golovchenko, J. A. Graphene as a subnanometer transelectrode membrane. *Nature* 467, 190 (2010).
38. Lim, C. X., Hoh, H. Y., Ang, P. K. & Loh, K. P. Direct Voltammetric Detection of DNA and pH Sensing on Epitaxial Graphene: An Insight into the Role of Oxygenated Defects. *Analytical Chemistry* 82, 7387 (2010).
39. Pisana, S., Braganca, P. M., Marinero, E. E. & Gurney, B. A. Tunable Nanoscale Graphene Magnetometers. *Nano Letters* 10, 341 (2010).
40. Pumera, M., Ambrosi, A., Bonanni, A., Chng, E. L. K. & Poh, H. L. Graphene for electrochemical sensing and biosensing. *Trac-Trends in Analytical Chemistry* 29, 954 (2010).
41. Wu, L., Chu, H. S., Koh, W. S. & Li, E. P. Highly sensitive graphene biosensors based on surface plasmon resonance. *Optics Express* 18, 14395 (2010).
42. Zhang, Y. H., Zhou, K. G., Xie, K. F., Gou, X. C., Zeng, J., Zhang, H. L. & Peng, Y. Effects of Stone-Wales Defect on the Interactions Between NH3, NO2 and Graphene. *Journal of Nanoscience and Nanotechnology* 10, 7347 (2010).
43. Li, X. S., Cai, W. W., An, J. H., Kim, S., Nah, J., Yang, D. X., Piner, R., Velamakanni, A., Jung, I., Tutuc, E., Banerjee, S. K., Colombo, L. & Ruoff, R. S. Large-Area Synthesis of High-Quality and Uniform Graphene Films on Copper Foils. *Science* 324, 1312-1314 (2009).
44. Obraztsov, A. N., Obraztsova, E. A., Tyurnina, A. V. & Zolotukhin, A. A. Chemical vapor deposition of thin graphite films of nanometer thickness. *Carbon* 45, 2017 (2007).
45. Cai, W. W., Piner, R. D., Zhu, Y. W., Li, X. S., Tan, Z. B., Floresca, H. C., Yang, C. L., Lu, L., Kim, M. J. & Ruoff, R. S. Synthesis of Isotopically-Labeled Graphite Films by Cold-Wall Chemical Vapor Deposition and Electronic Properties of Graphene Obtained from Such Films. *Nano Research* 2, 851 (2009).
46. Chae, S. J., Gunes, F., Kim, K. K., Kim, E. S., Han, G. H., Kim, S. M., Shin, H. J., Yoon, S. M., Choi, J. Y., Park, M. H., Yang, C. W., Pribat, D. & Lee, Y. H. Synthesis of Large-Area Graphene Layers on Poly-Nickel Substrate by Chemical Vapor Deposition: Wrinkle Formation. *Advanced Materials* 21, 2328 (2009).
47. Coraux, J., N'Diaye, A. T., Engler, M., Busse, C., Wall, D., Buckanie, N., Heringdorf, F., van Gastei, R., Poelsema, B. & Michely, T. Growth of graphene on Ir(111). *New Journal of Physics* 11 (2009).
48. De Arco, L. G., Zhang, Y., Kumar, A. & Zhou, C. W. Synthesis, Transfer, and Devices of Single- and Few-Layer 48. ...Graphene by Chemical Vapor Deposition. *Ieee Transactions on Nanotechnology* 8, 135 (2009).
49. Dervishi, E., Li, Z., Watanabe, F., Biswas, A., Xu, Y., Biris, A. R., Saini, V. & Biris, A. S. Large-scale graphene production by RF-cCVD method. *Chem Commun (Camb)*, 4061 (2009).
50. Gruneis, A., Kummer, K. & Vyalikh, D. V. Dynamics of graphene growth on a metal surface: a time-dependent photoemission study. *New Journal of Physics* 11 (2009).
51. Gunes, F., Han, G. H., Kim, K. K., Kim, E. S., Chae, S. J., Park, M. H., Jeong, H. K., Lim, S. C. & Lee, Y. H. Large-Area Graphene-Based Flexible Transparent Conducting Films. *Nano* 4, 83 (2009).
52. Kholmanov, I., Cavaliere, E., Fanetti, M., Cepek, C. & Gavioli, L. Growth of curved graphene sheets on graphite by chemical vapor deposition. *Physical Review B* 79 (2009).
53. Lee, Y. H. & Lee, J. H. Catalyst patterned growth of interconnecting graphene layer on SiO2/Si substrate for integrated devices. *Applied Physics Letters* 95 (2009).
54. Li, X., Zhu, Y., Cai, W., Borysiak, M., Han, B., Chen, D., Piner, R. D., Colombo, L. & Ruoff, R. S. Transfer of large-area graphene films for high-performance transparent conductive electrodes. *Nano Lett* 9, 4359 (2009).
55. Lopez, V., Sundaram, R. S., Gomez-Navarro, C., Olea, D., Burghard, M., Gomez-Herrero, J., Zamora, F. & Kern, K. Chemical Vapor Deposition Repair of Graphene Oxide: A Route to Highly Conductive Graphene Monolayers. *Advanced Materials* 21, 4683 (2009).
56. Reina, A., Jia, X. T., Ho, J., Nezich, D., Son, H. B., Bulovic, V., Dresselhaus, M. S. & Kong, J. Large Area, Few-Layer Graphene Films on Arbitrary Substrates by Chemical Vapor Deposition. *Nano Letters* 9, 30 (2009).
57. Reina, A., Thiele, S., Jia, X. T., Bhaviripudi, S., Dresselhaus, M. S., Schaefer, J. A. & Kong, J. Growth of Large-Area Single- and Bi-Layer Graphene by Controlled Carbon Precipitation on Polycrystalline Ni Surfaces. *Nano Research* 2, 509 (2009).
58. Reina, A., Jia, X. T., Ho, J., Nezich, D., Son, H. B., Bulovic, V., Dresselhaus, M. S. & Kong, J. Layer Area, Few-Layer Graphene Films on Arbitrary Substrates by Chemical Vapor Deposition. *Nano Letters* 9, 3087 (2009).
59. Sutter, P., Sadowski, J. T. & Sutter, E. Graphene on Pt(111): Growth and substrate interaction. *Physical Review B* 80 (2009).
60. Wei, D. C., Liu, Y. Q., Wang, Y., Zhang, H. L., Huang, L. P. & Yu, G. Synthesis of N-Doped Graphene by Chemical Vapor Deposition and Its Electrical Properties. *Nano Letters* 9. 1752 (2009).
61. Yuan, G. D., Zhang, W. J., Yang, Y., Tang, Y. B., Li, Y. Q., Wang, J. X., Meng, X. M., He, Z. B., Wu, C. M. L., Bello, I., Lee, C. S. & Lee, S. T. Graphene sheets via microwave chemical vapor deposition. *Chemical Physics Letters* 467, 361 (2009).
62. Bjelkevig, C., Mi, Z., Xiao, J., Dowben, P. A., Wang, L., Mei, W. N. & Kelber, J. A. Electronic structure of a graphene/hexagonal-BN heterostructure grown on Ru(0001) by chemical vapor deposition and atomic layer deposition: extrinsically doped graphene. *Journal of Physics-Condensed Matter* 22 (2010).
63. van der Zande, A. M., Barton, R. A., Alden, J. S., Ruiz-Vargas, C. S., Whitney, W. S., Pham, P. H. Q., Park, J., Parpia, J. M., Craighead, H. G. & McEuen, P. L. Large-Scale Arrays of Single-Layer Graphene Resonators. *Nano Letters* 10, 4869 (2010).
64. Park, H. J., Meyer, J., Roth, S. & Skakalova, V. Growth and properties of few-layer graphene prepared by chemical vapor deposition. *Carbon* 48, 1088 (2010).
65. Wu, W., Liu, Z. H., Jauregui, L. A., Yu, Q. K., Pillai, R., Cao, H. L., Bao, J. M., Chen, Y. P. & Pei, S. S. Wafer-scale synthesis of graphene by chemical vapor deposition and its application in hydrogen sensing. *Sensors and Actuators B-Chemical* 150, 296 (2010).
66. Cao, H. L., Yu, Q. K., Jauregui, L. A., Tian, J., Wu, W., Liu, Z., Jalilian, R., Benjamin, D. K., Jiang, Z., Bao, J., Pei, S. S. & Chen, Y. P. Electronic transport in chemical vapor deposited graphene synthesized on Cu: Quantum Hall effect and weak localization. *Applied Physics Letters* 96 (2010).
67. Cao, H. L., Yu, Q. K., Colby, R., Pandey, D., Park, C. S., Lian, J., Zemlyanov, D., Childres, I., Drachev, V., Stach, E. A., Hussain, M., Li, H., Pei, S. S. & Chen, Y. P. Large-scale graphitic thin films synthesized on Ni and transferred to insulators: Structural and electronic properties. *Journal of Applied Physics* 107 (2010).
68. Zheng, M., Takei, K., Hsia, B., Fang, H., Zhang, X. B., Ferralis, N., Ko, H., Chueh, Y. L., Zhang, Y. G., Maboudian, R. & Javey, A. Metal-catalyzed crystallization of amorphous carbon to graphene. *Applied Physics Letters* 96 (2010).
69. Sun, Z. Z., Yan, Z., Yao, J., Beitler, E., Zhu, Y. & Tour, J. M. Growth of graphene from solid carbon sources. *Nature* 468, 549 (2010).
70. Levendorf, M. P., Ruiz-Vargas, C. S., Garg, S. & Park, J. Transfer-Free Batch Fabrication of Single Layer Graphene Transistors. *Nano Letters* 9, 4479 (2009).
71. Bolotin, K. I., Ghahari, F., Shulman, M. D., Stormer, H. L. & Kim, P. Observation of the fractional quantum Hall effect in graphene. *Nature* 462, 196-199 (2009).
72. Du, X., Skachko, I., Duerr, F., Luican, A. & Andrei, E. Y. Fractional quantum Hall effect and insulating phase of Dirac electrons in graphene. *Nature* 462, 192-195 (2009).
73. Du, X., Skachko, I., Barker, A. & Andrei, E. Y. Approaching ballistic transport in suspended graphene. *Nature Nanotechnology* 3, 491 (2008).
74. Bolotin, K. I., Sikes, K. J., Jiang, Z., Klima, M., Fudenberg, G., Hone, J., Kim, P. & Stormer, H. L. Ultrahigh electron mobility in suspended graphene. *Solid State Communications* 146, 351 (2008).
75. Weitz, R. T., Allen, M. T., Feldman, B. E., Martin, J. & Yacoby, A. Broken-Symmetry States in Doubly Gated Suspended Bilayer Graphene. *Science* 330, 812 (2010).
76. Feldman, B. E., Martin, J. & Yacoby, A. Broken-symmetry states and divergent resistance in suspended bilayer graphene. *Nature Physics* 5, 889 (2009).
77. Diaz-Pinto, C., Wang, X. W., Lee, S., Hadjiev, V. G., De, D., Chu, W. K. & Peng, H. B. Tunable magnetoresistance behavior in suspended graphene multilayers through ion implantation. *Physical Review B* 83, 235410 (2011).
78. Lee, S., Wijesinghe, N., Diaz-Pinto, C. & Peng, H. B. Hot electron transport in suspended multilayer graphene. *Physical Review B* 82, 045411 (2010).
79. Peng, H. B., Hughes, M. E. & Golovchenko, J. A. Room-temperature single charge sensitivity in carbon nanotube field-effect transistors. *Applied Physics Letters* 89 (2006).
80. Chen, J. H., Jang, C., Xiao, S. D., Ishigami, M. & Fuhrer, M. S. Intrinsic and extrinsic performance limits of graphene devices on SiO2. *Nature Nanotechnology* 3, 206-209 (2008).

81. Malard, L. M., Pimenta, M. A., Dresselhaus, G. & Dresselhaus, M. S. Raman spectroscopy in graphene. *Physics Reports-Review Section of Physics Letters* 473, 51-87 (2009).
82. Sanyal, B., Eriksson, O., Jansson, U. & Grennberg, H. Molecular adsorption in graphene with divacancy defects. *Physical Review B* 79, 113409 (2009).
83. Shemella, P. & Nayak, S. K. Electronic structure and band-gap modulation of graphene via substrate surface chemistry. *Applied Physics Letters* 94, 032101 (2009).
84. Leenaerts, O., Partoens, B. & Peeters, F. M. Adsorption of H2O. NH3, CO, NO2, and NO on graphene: A first-principles study. *Physical Review B* 77, 125416 (2008).
85. Offermans, P., Tong, H. D., van Rijn, C. J. M., Merken, P., Brongersma, S. H. & Crego-Calama, M. Ultralow-power hydrogen sensing with single palladium nanowires. *Applied Physics Letters* 94, 223110 (2009).
86. Garcia, A. G., Baltazar, S. E., Castro, A. H. R., Robles, J. F. P. & Rubio, A. Influence of S and P Doping in a Graphene Sheet. *Journal of Computational and Theoretical Nanoscience* 5, 2221-2229 (2008).
87. Katz, E. Application of Bifunctional Reagents for Immobilization of Proteins on a Carbon Electrode Surface-Oriented Immobilization of Photosynthetic Reaction Centers. *Journal of Electroanalytical Chemistry* 365, 157-164 (1994).
88. Chen, R. J., Zhang, Y. G., Wang, D. W. & Dai, H. J. Noncovalent sidewall functionalization of single-walled carbon nanotubes for protein immobilization. *Journal of the American Chemical Society* 123, 3838-3839 (2001).
89. Kong, J., Chapline, M. G. & Dai, H. J. Functionalized carbon nanotubes for molecular hydrogen sensors. *Advanced Materials* 13, 1384-1386 (2001).
90. Britz, D. A. & Khlobystov, A. N. Noncovalent interactions of molecules with single walled carbon nanotubes. *Chemical Society Reviews* 35, 637-659 (2006).
91. Moser, J., Barreiro, A. & Bachtold, A. Current-induced cleaning of graphene. *Applied Physics Letters* 91, 163513 (2007).
92. Ralls, K. S., Skocpol, W. J., Jackel, L. D., Howard, R. E., Fetter, L. A., Epworth, R. W. & Tennant, D. M. Discrete Resistance Switching in Submicrometer Silicon Inversion-Layers—Individual Interface Traps and Low-Frequency (1-F Questionable) Noise. *Physical Review Letters* 52, 228-231 (1984).

The invention claimed is:

1. A graphene nano-sensor, comprising:
 a) a Si wafer;
 b) a thermal oxide layer disposed on top of the Si wafer;
 c) a first Cr supporting pad and a second Cr supporting pad disposed on top of the thermal oxide layer, the first and the second supporting pads having a gap between them;
 d) a first Cu pad disposed on top of the first Cr supporting pad, and a second Cu pad disposed on top of the second Cr supporting pad, the two Cu pads having a second gap between them;
 e) a graphene flake connecting the first and second Cu pads and suspended over the second gap between the two Cu pads; and
 f) two metal electrodes electrically connected to the graphene flake.

2. The graphene nano-sensor of claim 1, wherein the Cr supporting pads have lateral dimensions of from 0.5 µm×0.5 µm to 1000 µm×1000 µm, and thickness of from 0.5 nm to 500 nm.

3. The graphene nano-sensor of claim 1, wherein the gap between the two Cr supporting pads is from 50 nm to 50 µm wide.

4. The graphene nano-sensor of claim 1, wherein the two Cu pads are from 50 nm to 5000 nm thick.

5. The graphene nano-sensor of claim 1, wherein the thermal oxide layer is from 10 nm to 5000 nm thick.

6. The graphene nano-sensor of claim 1, wherein the metal electrodes comprise Pd and Cr.

7. The graphene nano-sensor of claim 1, wherein the graphene flake is a quasi-two-dimensional thin film.

8. The graphene nano-sensor of claim 1, wherein the graphene flake comprises a number of graphitic layers.

9. The graphene nano-sensor of claim 8, wherein the number of graphitic layers is between about 1 and 1000.

10. The graphene nano-sensor of claim 1, wherein the surface of the graphene flake is decorated with inorganic materials.

11. The graphene nano-sensor of claim 10, wherein the inorganic materials are selected from the group consisting of: Pd, $B_4C$, CdS, Ti, Au and Al.

12. The graphene nano-sensor of claim 1, wherein the surface of the graphene flake is functionalized with organic molecules.

13. The graphene nano-sensor of claim 12, wherein the organic molecules are selected form the group consisting of: DNA, a bifunctional molecule, 1-pyrenebutanoic acid, succinimidyl ester, and a layer of native hemin molecules.

14. A method for sensing single molecules, comprising the steps of:
 a) running a current through the graphene flake in the graphene nano-sensor of claim 1; and
 b) detecting a change in electrical conductance through the graphene flake.

15. A method of large scale production of suspended graphene devices, comprising the steps of:
 a) providing a Si wafer;
 b) depositing a thermal oxide layer on the Si wafer;
 c) patterning a first Cr supporting pad and a second Cr supporting pad on the thermal oxide layer, the first and the second supporting pads having a gap between them;
 d) patterning a first Cu pad on the first Cr supporting pad, and a second Cu pad on the second Cr supporting pad, the two Cu pads having a Cu strip connecting them;
 e) growing a graphene flake connecting the first and second Cu pads and suspended over the gap between the two Cu pads; and
 f) patterning two metal electrodes electrically connected to the graphene flake; and
 g) etching a portion of the Si and Cu layers.

* * * * *